(12) United States Patent
Yamashita

(10) Patent No.: US 10,640,059 B2
(45) Date of Patent: May 5, 2020

(54) DRIVE DEVICE

(71) Applicant: AISIN AW CO., LTD., Anjo-shi, Aichi-ken (JP)

(72) Inventor: Kento Yamashita, Nishio (JP)

(73) Assignee: AISIN AW CO., LTD., Anjo-shi, Aichi-Ken (JP)

( * ) Notice: Subject to any disclaimer, the term of this patent is extended or adjusted under 35 U.S.C. 154(b) by 188 days.

(21) Appl. No.: 15/570,482

(22) PCT Filed: Jul. 7, 2016

(86) PCT No.: PCT/JP2016/070152
§ 371 (c)(1),
(2) Date: Oct. 30, 2017

(87) PCT Pub. No.: WO2017/006996
PCT Pub. Date: Jan. 12, 2017

(65) Prior Publication Data
US 2018/0141506 A1    May 24, 2018

(30) Foreign Application Priority Data
Jul. 8, 2015    (JP) .................. 2015-136843

(51) Int. Cl.
*B60R 16/023* (2006.01)
*B60R 16/02* (2006.01)
(Continued)

(52) U.S. Cl.
CPC .......... *B60R 16/0231* (2013.01); *B60R 16/02* (2013.01); *B60R 16/0215* (2013.01);
(Continued)

(58) Field of Classification Search
CPC . B60R 16/02; B60R 16/0215; B60R 16/0231; H01L 29/7826; H01F 7/1844;
(Continued)

(56) References Cited

U.S. PATENT DOCUMENTS

2003/0021073 A1*   1/2003  Nagata .................. H03K 17/063
                                                          361/78

FOREIGN PATENT DOCUMENTS

JP    2006-349527 A    12/2006
JP    2012-182949 A     9/2012
(Continued)

OTHER PUBLICATIONS

Machine translation of Abe et al. Japanese Patent Document JP 2014-049975 A, Mar. 17, 2014 (Year: 2014).*
(Continued)

*Primary Examiner* — Kevin J Comber
(74) *Attorney, Agent, or Firm* — Sughrue Mion, PLLC

(57) ABSTRACT

A drive device includes: a first current path that has a high-side MOSFET; a second current path that has a low-side MOSFET; and a third current path connected to the other end portion of a coil and positioned between the first current path and the second current path. The drive device further includes: PWM drive circuits that generate a drive signal through PWM control; and an overcurrent detection circuit that detects that an overcurrent has flowed through the current paths. It is possible to precisely detect the occurrence of a battery short circuit and a ground short circuit by detecting which of the first current path and the second current path an overcurrent has flowed through.

8 Claims, 8 Drawing Sheets

(51) Int. Cl.
    *G05F 5/00*     (2006.01)
    *F16H 61/421*     (2010.01)
    *F16K 31/06*     (2006.01)
    *H01F 7/18*     (2006.01)
    *H01L 29/78*     (2006.01)
    *H03K 17/082*     (2006.01)
    *F02D 41/20*     (2006.01)
    *F16H 61/02*     (2006.01)

(52) U.S. Cl.
    CPC ....... *F16H 61/421* (2013.01); *F16K 31/0679* (2013.01); *G05F 5/00* (2013.01); *H01F 7/1844* (2013.01); *H01L 29/7826* (2013.01); *H03K 17/0822* (2013.01); *F02D 2041/2093* (2013.01); *F16H 2061/0255* (2013.01); *H01F 2007/1888* (2013.01)

(58) Field of Classification Search
    CPC ......... H01F 2007/1888; F16K 31/0679; G05F 5/00; F16H 61/421; F16H 2061/0255; H03K 17/0822; F02D 2041/2093
    USPC ....................................................... 361/152
    See application file for complete search history.

(56) References Cited

FOREIGN PATENT DOCUMENTS

| | | |
|---|---|---|
| JP | 2014-049975 A | 3/2014 |
| WO | 2015/118768 A1 | 8/2015 |

OTHER PUBLICATIONS

International Search Report of PCT/JP2016/070152 dated Sep. 20, 2016 [PCT/ISA/210].

\* cited by examiner

FAULT DETECTION LOGIC

| STATE | OVERCURRENT DETECTION | | DETECTED CURRENT VALUE ifb |
|---|---|---|---|
| | UPPER | LOWER | |
| NORMAL OPERATION | × | × | NO ABNORMALITY |
| TERMINALS OPEN | × | × | ifb ≈ 0 |
| GND SHORT CIRCUIT | ○ | × | ifb ≈ 0 |
| BATTERY SHORT CIRCUIT | × | ○ | REVERSE CURRENT DETECTED OR ifb ≈ 0 |

DRIVE DEVICE

CROSS REFERENCE TO RELATED APPLICATIONS

This application is a National Stage of International Application No. PCT/JP2016/070152, filed Jul. 7, 2016, claiming priority based on Japanese Patent Application No. 2015-136843, filed Jul. 8, 2015, the contents of all of which are incorporated herein by reference in their entirety.

TECHNICAL FIELD

The present technology relates to a drive device connected to a solenoid valve to be drivably controlled.

BACKGROUND ART

Hitherto, a mechanism that performs shifting by switching a hydraulic circuit by switching a solenoid between excited and non-excited states has been used to control shifting of automatic transmissions for vehicles. In this technology, a fault detection device has been known which is configured to detect a fault of a solenoid valve by electrically detecting the occurrence of an abnormality such as a wire breakage failure and a short circuit failure of a solenoid. In this technology, there is known a detection method in which a duty ratio for determination is set on the basis of a set duty ratio that serves as a target value in the case of a short circuit between terminals of a linear solenoid, a current for energization of which is controlled through PWM (Pulse Width Modulation) control, and a short circuit between terminals is determined in the case where the set duty ratio, which is set so as to reach the target value through feedback control, becomes less than the duty ratio for determination.

If it is attempted to precisely set the duty ratio for determination in the detection method, it is difficult to lower a target current for the linear solenoid, which may disadvantageously restrain the control range of a current for the linear solenoid. Thus, there is proposed a solenoid abnormality detection device with improved detection precision that can detect a short circuit abnormality of a linear solenoid without depending on the duty ratio of PWM control (see Patent Document 1). The solenoid abnormality detection device includes a voltage monitoring circuit that monitors a voltage applied to the linear solenoid, and is configured to compare the voltage which is monitored by the voltage monitoring circuit and a determination threshold set on the basis of a power source voltage of a power source that supplies power to the linear solenoid to determine a short circuit abnormality of the linear solenoid on the basis of the comparison results.

RELATED-ART DOCUMENTS

Patent Documents

[Patent Document 1] Japanese Patent Application Publication No. 2006-349527 (JP 2006-349527 A)

SUMMARY OF THE INVENTION

Problem to be Solved by the Invention

In the solenoid abnormality detection device described in Patent Document 1, the voltage monitoring circuit detects a signal potential at the point of connection between a current detection resistor and the linear solenoid, a detected monitor signal is provided to a microcomputer, and a short circuit abnormality is determined in accordance with a process flow described below in the case where a short circuit abnormality occurs in the linear solenoid. First, when a current flows through the linear solenoid with a PWM signal output from the microcomputer, the voltage monitoring circuit detects a signal (monitor signal) voltage at a predetermined point, and provides the detected voltage to the microcomputer. In the case where the monitor signal voltage is more than a determination threshold Vth, the linear solenoid is determined to be normal. In the case where the monitor signal voltage is less than the determination threshold Vth, on the other hand, the linear solenoid is determined to be subjected to a short circuit abnormality. However, the solenoid abnormality detection device can only detect a short circuit abnormality related to the solenoid and, moreover, cannot distinguish whether the short circuit abnormality related to the solenoid valve is a battery short circuit or a ground short circuit.

It is thus an aspect to provide a drive device that can precisely detect the occurrence of a battery short circuit and a ground short circuit.

Means for Solving the Problem

The present disclosure provides a drive device connected to a solenoid valve, one end portion of a coil of which is connected to a ground that is continuous with a negative electrode side of a battery and which is drivably controlled in accordance with a drive signal input to the other end portion of the coil, the drive device including:

a first current path that has a high-side switching element connected to a positive electrode side of the battery;

a second current path that has a low-side switching element connected to a ground that is continuous with the negative electrode side of the battery;

a third current path connected to the other end portion of the coil and positioned between the first current path and the second current path;

a drive unit that supplies a control signal to each of the high-side switching element and the low-side switching element and that performs control so as to generate the drive signal by alternately switching the first current path and the third current path, and the second current path and the third current path, between a conductive state and a non-conductive state; and an overcurrent detection unit that detects that an overcurrent that exceeds a value of a current that flows during normal supply of the drive signal has flowed through the first current path and the second current path.

Consequently, it is possible for the drive device which drives the solenoid valve to precisely detect the occurrence of a battery short circuit and a ground short circuit by detecting which of the first current path and the second current path an overcurrent has flowed through without separation based on a detected voltage.

PREFERRED EMBODIMENTS

First Embodiment

A first embodiment will be described below with reference to FIGS. 1 to 5. A linear solenoid is used as an inductive load to be drivably controlled by a drive device 9 according to the first embodiment. This also applies to a second embodiment to be discussed later.

Figure 1:
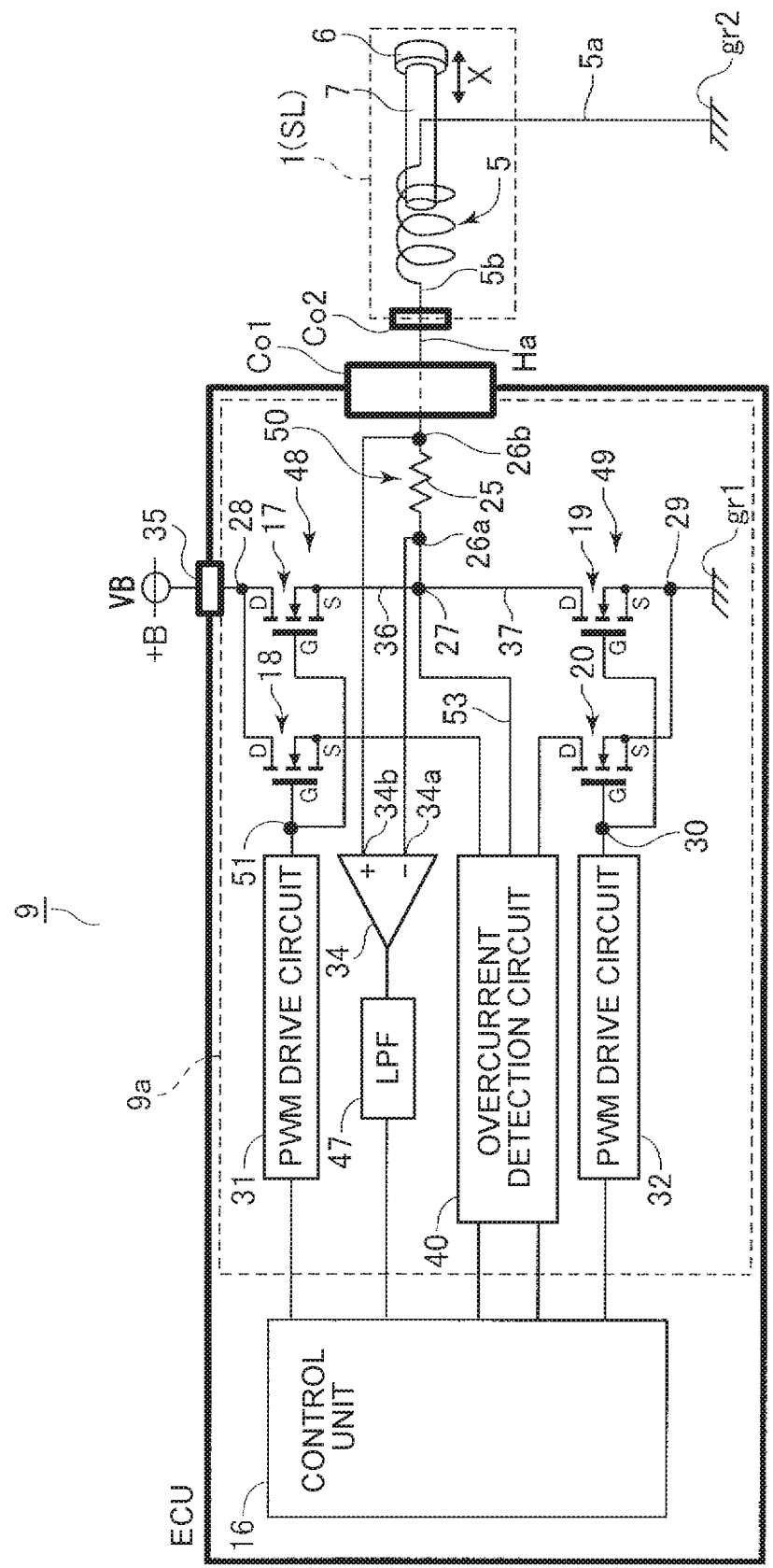
FIG. 1 is a diagram illustrating a drive device according to a first embodiment and a linear solenoid valve to which the drive device is connected.

First, the drive device 9 according to the present embodiment and associated components will be described with reference to FIG. 1. FIG. 1 is a diagram illustrating the drive device according to the present embodiment and the linear solenoid valve to which the drive device is connected.

An automatic transmission (not illustrated) suitably used in vehicles includes the drive device 9 which is constituted of an ECU (Electronic Control Unit). In FIG. 1, a solenoid portion 1 of a linear solenoid valve SL, which is a solenoid valve, is connected to the drive device 9 via connectors Co1 and Co2. One end portion 5a of a coil 5 of the linear solenoid valve SL is connected to a ground gr2 which is continuous with a negative electrode side of a battery VB. The linear solenoid valve SL is drivably controlled in accordance with a drive signal input to the other end portion 5b of the coil 5. Reference numeral 35 denotes a connector that connects a positive electrode (+B) side of the battery VB to the drive device 9.

The other end portion 5b of the coil 5 is connected to the connector Co1 via a harness Ha and the connector Co2. The linear solenoid valve SL which has the coil 5 is configured as follows. That is, in the case where the linear solenoid valve SL is provided in a hydraulic control device, for example, the linear solenoid valve SL can output a supplied hydraulic pressure as a control hydraulic pressure that matches an input drive signal, and is constituted from the solenoid portion 1 and a pressure regulation valve portion (not illustrated).

In the solenoid portion 1, the coil 5 is fitted on the radially outer side of a stator core (not illustrated), a plunger 6 is disposed opposite the distal end of the stator core, and a shaft 7 integrally fixed to the plunger 6 is supported on the stator core (not illustrated). The shaft 7 penetrates a center hole of the stator core to abut against a spool (not illustrated) of the pressure regulation valve portion. The solenoid portion 1 forms a magnetic circuit that passes through the plunger 6 and the stator core on the basis of a current that flows through the coil 5 which is supplied with the drive signal, and causes the plunger 6 to generate a magnetic attraction force that matches the value of the current which flows through the coil 5 using the plunger 6 and an attraction portion of the stator core. Movement of the plunger 6 due to the magnetic attraction force is transferred to the spool via the shaft 7 to operate the pressure regulation valve portion (not illustrated). Consequently, an output pressure from an output port (not illustrated) is regulated linearly. A movable element constituted of the shaft 7 and the plunger 6 is moved to be advanced and retracted in the direction of an arrow X with respect to the coil 5.

The connector Co1 is provided on a substrate (motherboard) (not illustrated) of the ECU which serves as the drive device 9. The connector Co2 which is attached to the distal end of the harness Ha which is connected to the connector Co1 is connected to a terminal of a terminal (not illustrated) provided to the solenoid portion 1 in the linear solenoid valve SL. Thus, a wire breakage (OPEN) to be discussed later is caused when the harness Ha is disconnected from the connector Co1, when the connector Co2 which is attached to the distal end of the harness Ha is disconnected from the terminal of the solenoid portion 1, or when the harness Ha is tangled so that the harness Ha itself is cut. Meanwhile, a battery short circuit and a ground short circuit to be discussed later are caused when insulation is damaged with foreign matter entering a slight gap between the connector Co1 and the connector Co2 to cause a short circuit with the positive electrode side of the battery VB or a valve body.

The valve body (not illustrated) which includes the hydraulic control device (not illustrated) which is provided with the linear solenoid valve SL etc. is connected to the negative electrode side of the battery VB via a vehicle frame etc. Therefore, the ground gr2 which is connected to the negative electrode side via the valve body, the vehicle frame, etc. has a slight resistance value, and is not at a potential of 0 [V]. Meanwhile, a terminal of the substrate (not illustrated) of the ECU is connected to the negative electrode side of the battery VB via a wire (not illustrated). Therefore, a ground gr1 to be discussed later has a very small resistance value, and is considered to be at a potential of 0 [V].

The drive device 9 (ECU) is connected to a shift operation lever (not illustrated) installed in the vicinity of a driver's seat of the vehicle (not illustrated), and has one control unit 16 that has a CPU, a RAM, and a ROM, and a plurality of control drive units 9a connected to the control unit 16. That is, the drive device 9 has not only the control drive unit 9a of FIG. 1 corresponding to the linear solenoid valve SL, but also a number of control drive units 9a respectively corresponding to other linear solenoid valves SL in the case where there are any such linear solenoid valves SL. The control unit 16 can drivably control the linear solenoid valves SL via the plurality of control drive units 9a.

As illustrated in FIG. 1, the drive device 9, which is connected to the upstream side of the linear solenoid valve SL in the supply direction of the drive signal, has a first current path 48 and a second current path 49 provided in the control drive unit 9a to extend in series between the positive electrode (+B) side of the battery VB and the ground gr1 which is continuous with the negative electrode side. The drive device 9 is configured to be switchable among a P (parking) range, an R (reverse) range, an N (neutral) range, and a D (drive) range in accordance with an operation of the shift operation lever (not illustrated). The shift operation lever is configured to be operable to select the P range, the R range, the N range, and the D range in this order in the moving direction thereof.

A shift position signal from a shift position sensor (not illustrated) is input to the control unit 16 of the drive device 9. The shift position sensor is configured to detect the operation position of the shift operation lever (not illustrated) and output a shift position signal in conjunction with an operation of the shift operation lever to the P range, the R range, the N range, and the D range. In addition, an output shaft rotational speed signal detected by an output shaft rotational speed (vehicle speed) sensor (not illustrated) on the basis of rotation of an output shaft 75 (see FIG. 1) is input to the control unit 16.

The first current path 48 is provided with a MOSFET (metal oxide semiconductor field effect transistor) 17 (hereinafter referred to as a "high-side MOSFET 17") that serves as a high-side switching element connected to the positive electrode (+B) side of the battery VB. Meanwhile, the second current path 49 is provided with a low-side MOSFET 19 that serves as a low-side switching element connected to the ground gr1 which is continuous with the negative electrode side of the battery. The high-side MOSFET 17 and the low-side MOSFET 19 are constituted from MOSFETs of the same conductivity type, that is, N-channel MOSFETs. These MOSFETs are constituted from power MOSFETs. This also applies to a first determination MOSFET 18 and a second determination MOSFET 20 to be discussed later. In the present embodiment, circuitry in which MOSFETs are used is described. However, the present description is not limited thereto, and circuitry in which MISFETs (metal insulator semiconductor field effect transistors), bipolar transistors, or the like are used may also be used. The same effect can be obtained also in such cases.

A gate (signal input electrode) G of the high-side MOSFET 17 is connected to a PWM drive circuit 31. A drain D, which is one end of the current path, is connected to the positive electrode (+B) side of the battery. A source S, which is the other end of the current path, is connected to a connection node (connection portion) 27. Meanwhile, a gate (signal input electrode) G of the low-side MOSFET 19 is connected to a PWM drive circuit 32. A source S, which is one end of the current path, is connected to the ground gr1. A drain D, which is the other end of the current path, is connected to the connection node 27.

In the present embodiment, mainly, the high-side MOSFET 17 functions to control a current so as to supply a drive signal to the linear solenoid valve SL, and the low-side MOSFET 19 functions to release energy accumulated in the linear solenoid valve SL when the high-side MOSFET 17 is off. That is, the drive device 9 adopts a synchronous rectification method, in which the high-side MOSFET 17 is turned on and off by the input to control the amount of energy to be supplied to the linear solenoid valve SL, and the low-side MOSFET 19 causes the linear solenoid valve SL to output energy in the direction opposite to the direction of the input from the high-side MOSFET 17 in accordance with the turning on and off.

The drive device 9 also has a third current path 50 provided in the control drive unit 9a and connected to the connection node 27 between the first current path 48 and the second current path 49. The third current path 50 has a connector Co provided on the substrate (not illustrated) and a resistor (shunt resistor) 25, one terminal 26a and the other terminal 26b of which are connected between the connection node 27 and the connector Co.

The drive device 9 also has the N-channel first determination MOSFET 18 and second determination MOSFET 20, which are of the same conductivity type as the high-side MOSFET 17 and the low-side MOSFET 19. A gate (signal input electrode) G of the first determination MOSFET 18 is connected to the PWM drive circuit 31. A drain D, which is one end of the current path, is connected between the high-side MOSFET 17 in the first current path 48 and the positive electrode (+B) of the battery. The PWM drive circuits 31 and 32 constitute a drive unit.

A source S, which is the other end of the current path, of the first determination MOSFET 18 is connected to an overcurrent detection circuit 40 to be discussed later. In FIG. 1, reference numeral 51 denotes a connection node that connects the respective gates G of the first determination MOSFET 18 and the high-side MOSFET 17 to the output of the PWM drive circuit 31, and reference numeral 30 denotes a connection node that connects the respective gates G of the second determination MOSFET 20 and the low-side MOSFET 19 to the output of the PWM drive circuit 32, of the PWM drive circuits 31 and 32.

Meanwhile, a gate (signal input electrode) G of the second determination MOSFET 20 is connected to the PWM drive circuit 32. A source S, which is one end of the current path, is connected to a connection node 29 (connection portion) 29 between the source S, which is one end of the current path, of the low-side MOSFET 19 in the second current path 49 and the ground gr1. A drain D, which is the other end of the current path, of the second determination MOSFET 20 is connected to the overcurrent detection circuit 40. In addition, the connection node 27 is connected to the overcurrent detection circuit 40 via a wire 53.

The high-side MOSFET (high-side transistor) 17, the low-side MOSFET (low-side transistor) 19, the first determination MOSFET (first determination transistor) 18, and the second determination MOSFET (second determination transistor) 20, which are provided in the drive device 9, are each constituted from an N-channel MOSFET of an enhancement type. In this case, the enhancement type is advantageous in that drive control is performed simply since no current flows when the gate voltage is 0 [V].

Alternatively, the high-side MOSFET 17, the low-side MOSFET 19, the first determination MOSFET 18, and the second determination MOSFET 20 can be constituted from a P-channel MOSFET of an enhancement type. Furthermore, the high-side MOSFET 17, the low-side MOSFET 19, the first determination MOSFET 18, and the second determination MOSFET 20 can be constituted from an N-channel or P-channel MISFET of an enhancement type. Also in such cases, the same effect as that obtained with the N-channel MOSFETs can be obtained.

The drive device 9 has the PWM drive circuits 31 and 32, which serve as the drive unit, a current detection circuit 34 that serves as a current detection unit, and the overcurrent detection circuit 40 which serves as an overcurrent detection unit, which are connected to the control unit 16.

The PWM drive circuit 31 supplies the high-side MOSFET 17 with a PWM signal (see FIG. 4) that serves as the control signal. The PWM drive circuit 32 supplies the low-side MOSFET 19 with a PWM signal (see FIG. 4) that serves as the control signal. The PWM drive circuits 31 and 32 perform PWM control so as to generate a drive signal for the linear solenoid valve SL by alternately switching the first current path 48 and the third current path 50, and the second current path 49 and the third current path 50, between a conductive state and a non-conductive state. In the present embodiment, PWM control is performed so as to supply a PWM signal as the control signal. However, the present embodiment is not limited thereto, and control can be performed so as to supply a control signal for a so-called on/off solenoid that is simply controlled so as to be turned on and off, rather than being subjected to PWM drive.

In addition, the gate G of the first determination MOSFET 18 is connected to the PWM drive circuit 31 together with the gate G of the high-side MOSFET 17. Therefore, when the PWM drive circuit 31 applies Low (−) of the PWM signal to the gate G of the high-side MOSFET 17 after applying High (+), for example, Low (−) of the PWM signal is also applied to the gate G of the first determination MOSFET 18 after High (+) is applied, so that the MOSFET 18 is activated at the same timing (in the same phase) as the high-side MOSFET 17. Furthermore, the gate G of the second determination MOSFET 20 is connected to the PWM drive circuit 32 together with the gate G of the low-side MOSFET 19. Therefore, when the PWM drive circuit 32 applies Low (−) of the PWM signal to the gate G of the low-side MOSFET 19 after applying High (+), for example, Low (−) of the PWM signal is also applied to the gate G of the low-side MOSFET 19 after High (+) is applied, so that the MOSFET 20 is activated at the same timing (in the same phase) as the low-side MOSFET 19.

The overcurrent detection circuit 40 detects that an overcurrent that exceeds the value of a current that flows during normal supply of a drive signal to the linear solenoid valve SL has flowed through one of the first current path 48 and the second current path 49. The overcurrent detection circuit 40 stores the value of the current which flows during normal supply as a predetermined range current value [mA] for overcurrent detection, and always compares the values of currents that flow into the overcurrent detection circuit 40 via the first determination MOSFET 18 and the second determination MOSFET 20 with the predetermined current value [mA]. In the case where the overcurrent detection circuit 40 has detected a current value (overcurrent) that exceeds the predetermined current value [mA], the control unit 16 which has received the current value executes short circuit determination processing (determination processing) to be described below.

That is, in the case where the overcurrent detection circuit 40 detects via the first determination MOSFET 18 that an overcurrent has flowed through the first current path 48, the control unit 16 determines the occurrence of a ground short circuit at a voltage lower than the normal operation range of the linear solenoid valve SL. In the case where the overcurrent detection circuit 40 detects via the second determination MOSFET 20 that an overcurrent has flowed through the second current path 49, meanwhile, the control unit 16 determines the occurrence of a battery short circuit at a voltage higher than the normal operation range of the linear solenoid valve SL.

Here, in the case where an overcurrent has flowed through the first current path 48, the overcurrent flows into the overcurrent detection circuit 40 via the first determination MOSFET 18 which is activated in the same phase as the MOSFET 17, and therefore the overcurrent is adequately detected by the overcurrent detection circuit 40. In the case where an overcurrent has flowed through the second current path 49, meanwhile, the overcurrent flows into the ground gr1 via the low-side MOSFET 19, and the second determination MOSFET 20 is activated in the same phase as the low-side MOSFET 19, so that an overcurrent that flows through the overcurrent detection circuit 40 via the connection node 27 and the wire 53 flows from the connection node 29 into the ground gr1 via the second determination MOSFET 20. Consequently, the overcurrent which flows through the second current path 49 is adequately detected by the overcurrent detection circuit 40.

The current detection circuit 34 is constituted from an operational amplifier, and detects a current that flows through the coil 5 by way of the third current path 50. The current detection circuit 34 detects a current value while differentially amplifying a voltage (voltage drop) generated across both ends of the resistor 25 when a PWM signal is supplied to the coil 5 from the high-side MOSFET 17 and the low-side MOSFET 19, and outputs the differentially amplified signal to the control unit 16 via a low-pass filter (LPF) 47. Here, one terminal 26a of the resistor 25, which is connected between the connector Co and the connection node 27 in the third current path 50, is connected to an inverting input terminal (−) 34a of the current detection circuit 34, which is constituted from an operational amplifier, and the other terminal 26b is connected to a non-inverting input terminal (+) of the current detection circuit 34.

In the linear solenoid valve SL, when a drive signal supplied via the resistor 25, the connector Co, and the harness Ha is supplied to the coil 5 through the other end portion 5b, the coil 5 is excited in accordance with the current value of the drive signal, and the movable element which is constituted from the shaft 7 and the plunger 6 is attracted to be moved in the attraction direction (e.g. leftward in FIG. 1). Consequently, the spool (not illustrated) is moved to a pressure regulation position together with the movable element to regulate the output pressure from the output port (not illustrated). In this event, when the drive signal flows from the connection node 27 to the resistor 25, a voltage drop is caused in the direction in which a current flows. The current detection circuit 34 detects a current value by differentially amplifying the voltage across both ends of the resistor 25 to a voltage based on GND. The control unit 16 determines the current value. That is, in the case where the current which flows through the third current path 50 is no longer detected by the current detection circuit 34, the control unit 16 determines a wire breakage state in which the linear solenoid valve SL is disconnected from the connector Co or the like (a wire breakage state with electrical disconnection), and can execute wire breakage determination processing in which a wire breakage flag is turned on (see step S7 of FIG. 5).

Figure 2A:
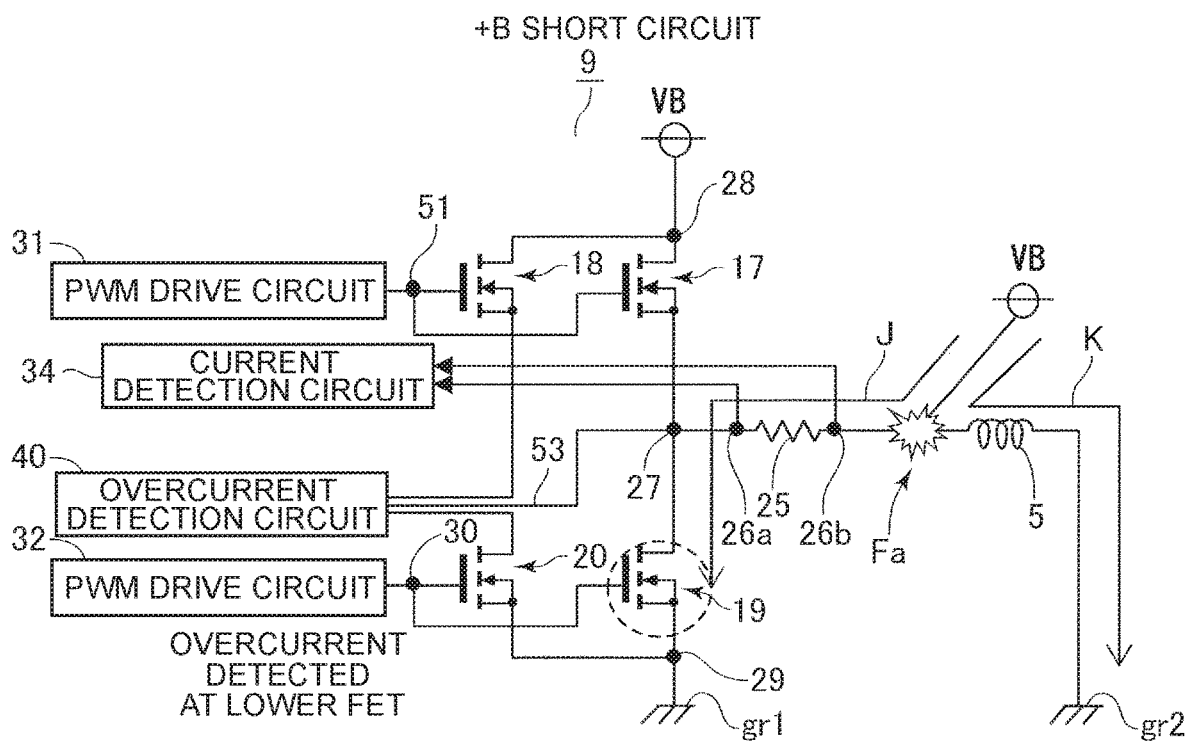
FIG. 2A is a circuit diagram illustrating a part of the drive device according to the first embodiment and illustrating a state during a battery short circuit.
Figure 2B:
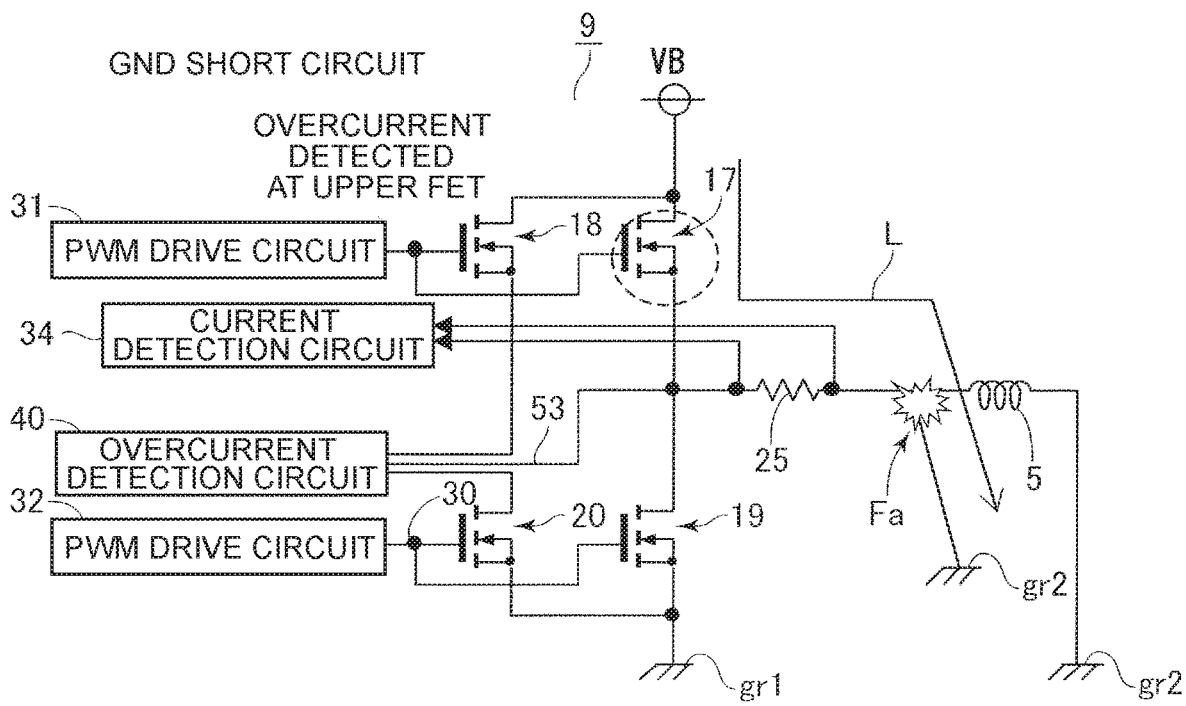
FIG. 2B is a circuit diagram illustrating a part of the drive device according to the first embodiment and illustrating a state during a ground short circuit.
Figures 3A, 3B:
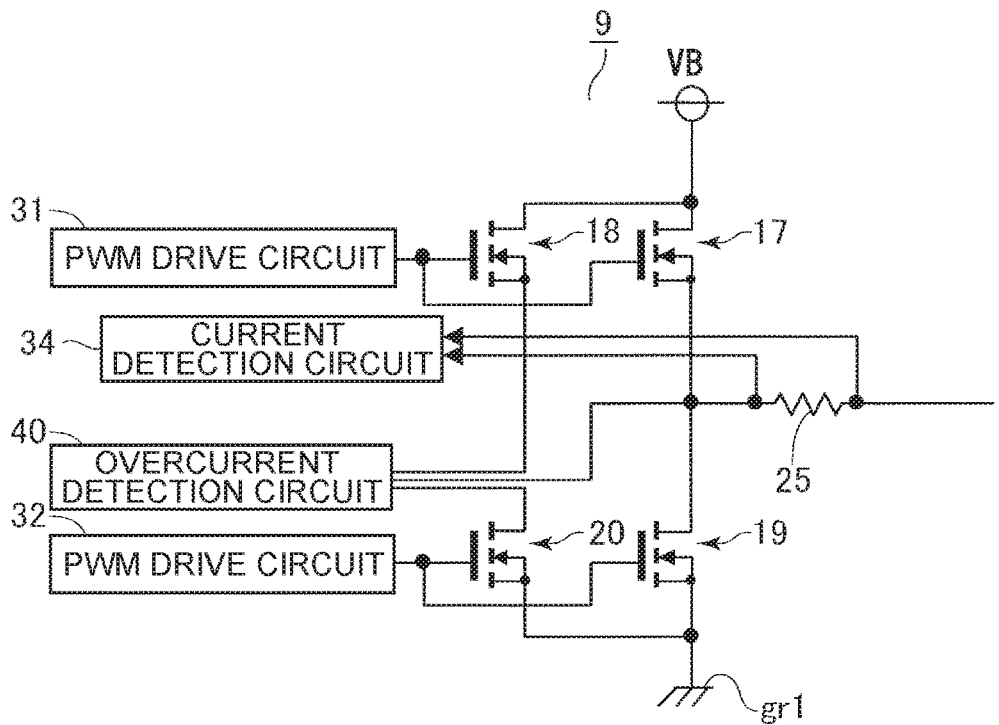
FIG. 3A is a circuit diagram illustrating a part of the drive device according to the first embodiment and illustrating a state during a wire breakage.
FIG. 3B is a table illustrating an abnormality detection logic used by the drive device illustrated in FIG. 3A.
Figure 4:
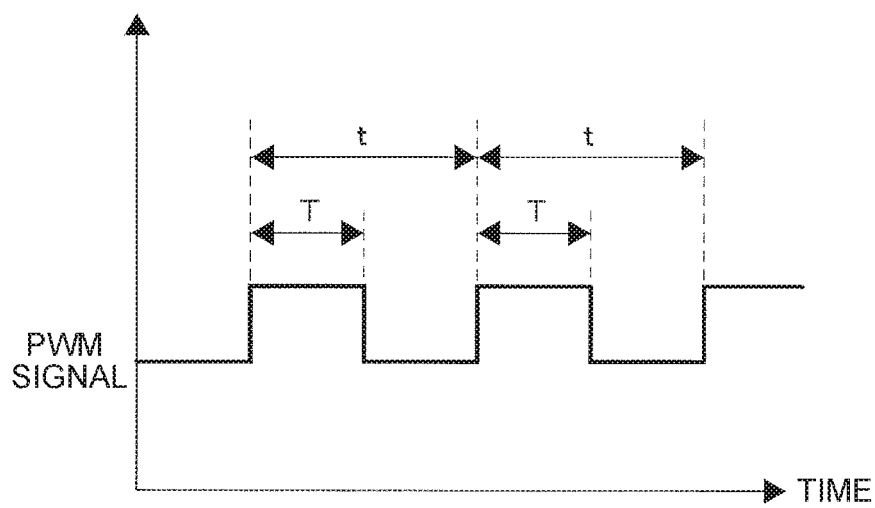
FIG. 4 briefly illustrates a PWM signal used in PWM control according to the first embodiment.
Figure 5:
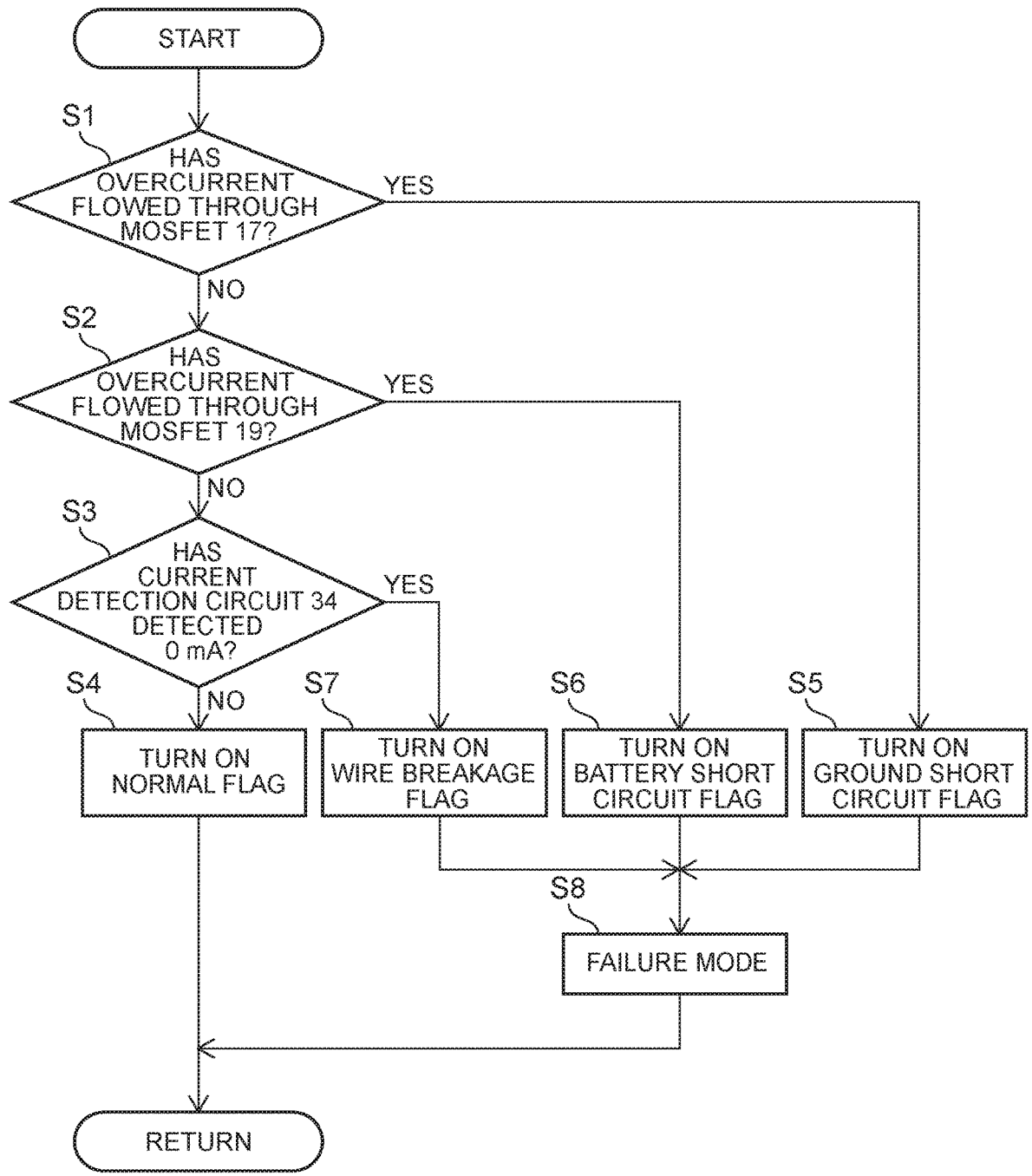
FIG. 5 is a flowchart illustrating abnormality type determination processing according to the first embodiment.

Next, the function of the present embodiment will be described with reference to FIGS. 2A, 2B, 3A, 3B, 4, and 5. FIG. 2A is a circuit diagram of the drive device according to the present embodiment in a state with a battery short circuit. FIG. 2B is a circuit diagram of the drive device according to the present embodiment in a state with a ground short circuit. FIG. 3A is a circuit diagram illustrating a part of the drive device according to the present embodiment and illustrating a state during a wire breakage. FIG. 3B is a table illustrating an abnormality detection logic used by the drive device illustrated in FIG. 3A. FIG. 4 briefly illustrates the PWM signal which is used in the PWM control according to the present embodiment. FIG. 5 is a flowchart illustrating abnormality type determination processing according to the present embodiment.

In the present embodiment, during drive of the PWM drive circuits 31 and 32 performed by the control unit 16, the solenoid portion 1 of the linear solenoid valve SL is driven to be advanced and retracted linearly by performing feedback control while variably controlling the average output during a passage time by varying the duty ratio (ratio of on time) of pulses by varying the proportions of high (High "1") and low (Low "0") of a pulse signal (PWM signal) with constant cycles.

Therefore, the PWM drive circuits 31 and 32 provide a PWM signal having a PWM pulse width T (that is, pulse width for high) with constant cycles t as illustrated in FIG. 4 to the respective gates G of the high-side MOSFET 17 and the low-side MOSFET 19 via the connection nodes 51 and 30. With the PWM signal applied to the respective gates the high-side MOSFET 17 is activated to be turned on when the pulses of the PWM signal are at High (+) and turned off when the pulses are at Low (−). On the other hand, the low-side MOSFET 19 is activated by a PWM signal that is out of phase with the PWM signal for the high-side MOSFET 17 to be turned on when the pulses of the PWM signal are at High (+) and turned off when the pulses are at Low (−). Consequently, a drive signal corresponding to the PWM signal is supplied to the other end portion 5b of the solenoid portion 1 via the third current path 50 and the harness Ha through a current path between the drain and the source of the high-side MOSFET 17, or through a current path between the source and the drain of the low-side MOSFET 19, to drive the linear solenoid valve SL.

In the case where an overcurrent is not detected (×) at the high-side MOSFET 17 on the upper side or the low-side MOSFET 19 on the lower side, for example, when the linear solenoid valve SL is driven, the control unit 16 determines normal operation with the overcurrent detection circuit 40 detecting a current value (ifb) indicating "no abnormality" in the fault detection logic table illustrated in FIG. 3B.

When a battery short circuit in which the harness Ha is caught in the valve body, for example, to be short-circuited with the positive electrode (+B) of the battery VB is caused (at a portion indicated by an arrow Fa) as illustrated in FIG. 2A, and in the case where an overcurrent flows in the direction of an arrow J in the drawing, the overcurrent flows through the low-side MOSFET 19 on the lower side. In this case, an overcurrent is not detected (×) at the high-side MOSFET 17 on the upper side and an overcurrent at the low-side MOSFET 19 on the lower side is detected via the second determination MOSFET 20 (○) in the fault detection logic table, and the control unit 16 determines the occurrence of a battery short circuit at a voltage higher than the normal operation range of the linear solenoid valve SL with the overcurrent detection circuit 40 detecting a current value (ifb) indicating "reverse current detected". In the case where an overcurrent flows in the direction of an arrow K in the drawing, the control unit 16 determines the occurrence of a battery short circuit although the overcurrent detection circuit 40 detects a current value ifb≈0.

Meanwhile, when a ground short circuit with the negative electrode (ground gr2) of the battery VB is caused (at a portion indicated by an arrow Fa) as illustrated in FIG. 2B, an overcurrent flows in the direction of an arrow L in the drawing, and the overcurrent flows through the high-side MOSFET 17 on the upper side. In this case, an overcurrent is detected (○) at the high-side MOSFET 17 on the upper side and an overcurrent is not detected (×) at the low-side MOSFET 19 on the lower side in the fault detection logic table, and the control unit 16 determines the occurrence of a ground short circuit at a voltage lower than the normal operation range of the linear solenoid valve SL with the overcurrent detection circuit 40 detecting a current value ifb≈0.

Meanwhile, when a wire breakage is caused (at a portion indicated by an arrow Fa) with the harness Ha disconnected from the connector Co (see FIG. 1), for example, as illustrated in FIG. 2A, an overcurrent does not flow (×) through the high-side MOSFET 17 on the upper side or the low-side MOSFET 19 on the lower side in the fault detection logic table, and the control unit 16 determines the occurrence of open terminals (a wire breakage) with the overcurrent detection circuit 40 detecting a current value ifb≈0.

The above function will be described with reference to the flowchart of FIG. 5. FIG. 5 is a flowchart illustrating abnormality type determination processing according to the present embodiment.

That is, as illustrated in FIG. 5, the control unit 16 determines, via the overcurrent detection circuit 40, whether or not an overcurrent has flowed through the high-side MOSFET 17 (step S1). In the case where it is determined, as a result, that an overcurrent has flowed through the high-side MOSFET 17 (step S1: YES), the control unit 16 proceeds to step S5 and turns on a ground short circuit flag, and starts a failure mode in step S8. Prior to starting the failure mode, the control unit 16 stops supply of a PWM signal by stopping drive of the PWM drive circuits 31 and 32 for the linear solenoid valve SL corresponding to a ground short circuit, and forcibly interrupts supply of a drive signal to the linear solenoid valve SL.

In the case where it is determined in step S1 that an overcurrent has not flowed through the high-side MOSFET 17 (step S1: NO), on the other hand, the control unit 16 proceeds to step S2 and determines, via the overcurrent detection circuit 40, whether or not an overcurrent has flowed through the low-side MOSFET 19. In the case where it is determined, as a result, that an overcurrent has flowed through the low-side MOSFET 19 (step S2: YES), the control unit 16 proceeds to step S6 and turns on a battery short circuit flag, and starts the failure mode in step S8.

In the case where it is determined in step S2 that an overcurrent has not flowed through the low-side MOSFET 19 (step S2: NO), further, the control unit 16 proceeds to step S3 and determines, via the current detection circuit 34, that the linear solenoid valve SL is in a wire breakage state. That is, in the case where the current detection circuit 34 detects a current value of 0 [mA] (step S3: YES), the control unit 16 determines a wire breakage state related to the linear solenoid valve SL and turns on a wire breakage flag (wire breakage determination processing) in step S7, and starts the failure mode in step S8.

Comparative Example

Figure 8:
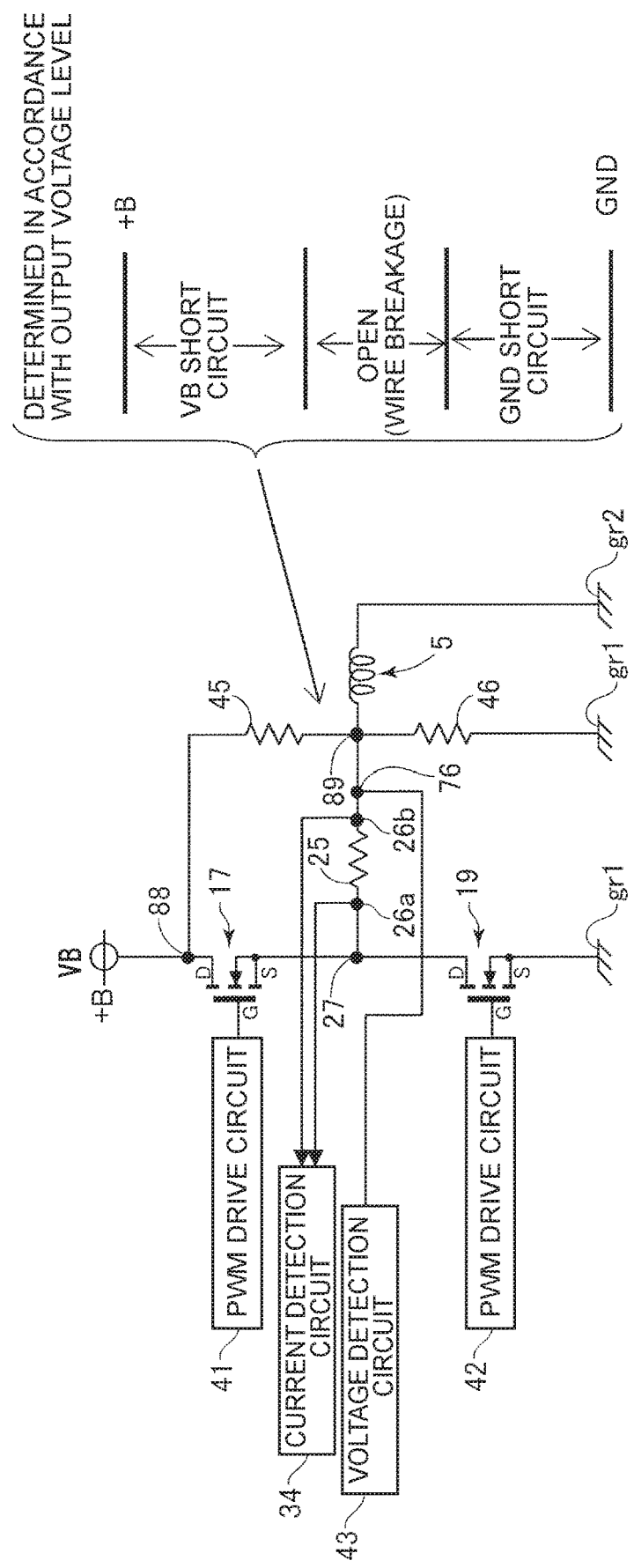
FIG. 8 is a circuit diagram illustrating a part of the configuration of a drive device according to a comparative example.

The configuration of a drive device that does not have the first determination MOSFET 18, the second determination MOSFET 20, or the overcurrent detection circuit 40 of the present embodiment and that serves as the basis of the present embodiment will be described as a comparative example with reference to FIG. 8. FIG. 8 is a circuit diagram illustrating a part of the configuration of the drive device according to the comparative example. In the comparative example, members that are the same as those of the first embodiment are denoted by the same reference numerals, and members with the same configuration and function will not be described.

That is, as illustrated in FIG. 8, the drive device according to the comparative example is connected to the upstream side of the coil 5 of the linear solenoid valve SL (see FIG. 1) in the supply direction of the drive signal, and has a high-side MOSFET 17 and a low-side MOSFET 19 provided in series between the positive electrode (+B) side of the battery VB and the ground gr1 which is continuous with the negative electrode side. The drive device has a voltage detection circuit 43 with its detection end 76 connected between the other terminal 26b of the resistor 25 and a connection node 89, and is configured to detect an abnormality such as an overcurrent related to the linear solenoid valve SL so as to separately determine abnormality modes related to a battery short circuit (VB short circuit), a ground short circuit (GND short circuit), and a wire breakage (OPEN) by the voltage detection circuit 43 detecting voltages obtained by dividing an output terminal voltage using resistors 45 and 46. One end side of the resistor 45 is connected to a connection node 88 between the drain D of the high-side MOSFET 17 and the positive electrode (+B) of the battery VB. The other end side of the resistor 45 is connected to the connection node 89. One end side of the resistor 46 is connected to the connection node 89. The other end side of the resistor 46 is connected to the ground gr1.

The drive device according to the comparative example configured as described above determines an abnormality by separately detecting only voltages obtained by dividing the output terminal voltage using the resistors 45 and 46. Therefore, the drive device may not be able to perform detection depending on the short circuit voltage, and may not be able to perform detection in the case where a battery short circuit has occurred at a voltage level of a wire breakage. During a short circuit abnormality in which an overcurrent flows, meanwhile, it is necessary to interrupt the output when an abnormality is determined in the case where a current at a set value or more has flowed. However, sufficient measures may not be taken against the overcurrent if the overcurrent cannot be detected precisely.

In the present embodiment, in contrast to the comparative example described above, the drive device has the first determination MOSFET 18, the second determination MOSFET 20, and the overcurrent detection circuit 40. Thus, the control unit 16 can execute short circuit determination processing (determination processing) which allows accurately determining which of a ground short circuit and a battery short circuit has occurred in accordance with which of the first current path 48 and the second current path 49 an overcurrent is detected in without separation based on the detected voltage. In the present embodiment, in the case where the current which flows through the third current path 50 is no longer detected by the current detection circuit 34, the control unit 16 can execute wire breakage determination processing in which a wire breakage state related to the linear solenoid valve SL is determined. Consequently, the drive device 9 according to the present embodiment can precisely determine an abnormality that has occurred.

Second Embodiment

Figure 6:
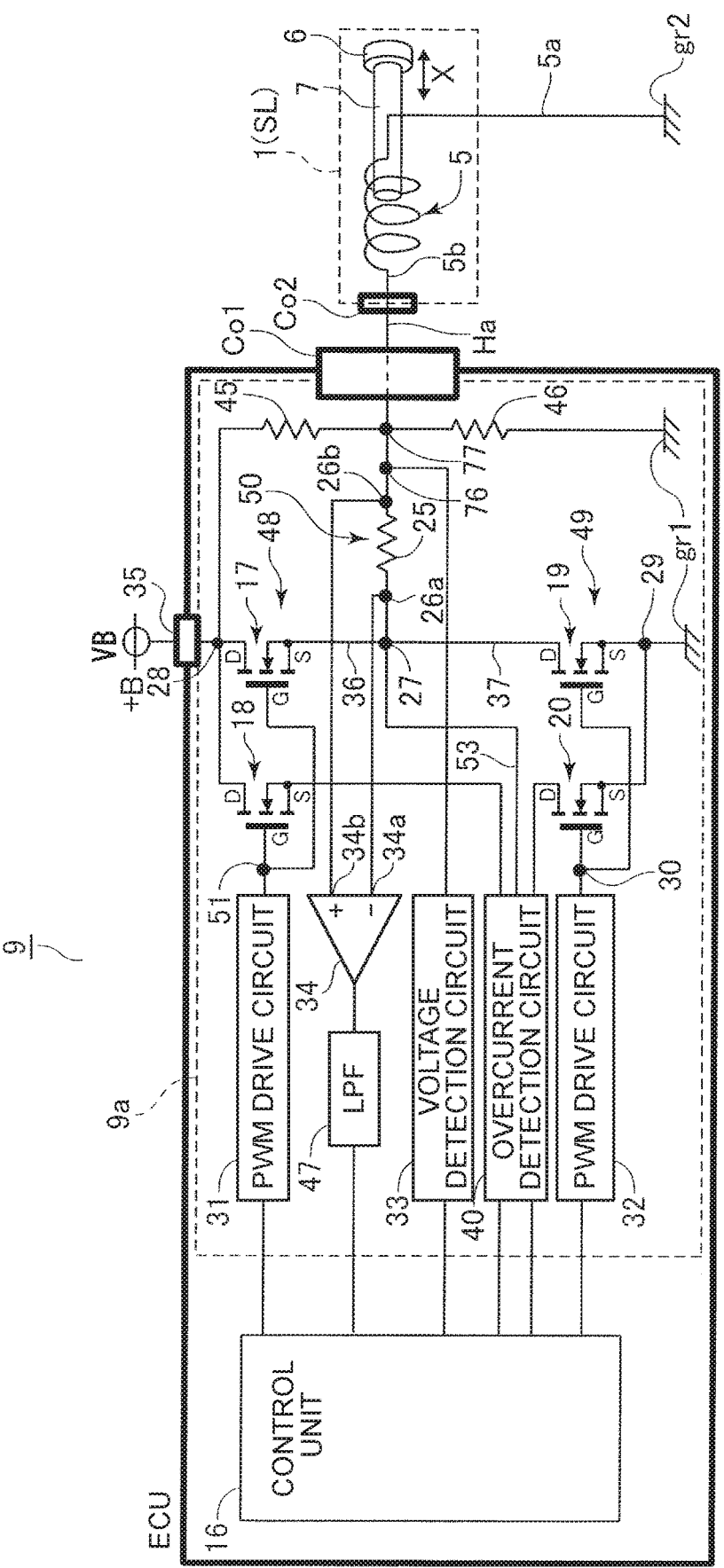
FIG. 6 is a diagram illustrating a drive device according to a second embodiment and a linear solenoid valve to which the drive device is connected.

Next, a drive device according to a second embodiment will be described with reference to FIG. 6. FIG. 6 is a diagram illustrating the drive device according to the present embodiment and the linear solenoid valve to which the drive device is connected. In the present embodiment, members that are the same as those of the first embodiment are denoted by the same reference numerals, and members with the same configuration and function will not be described.

That is, the drive device 9 according to the present embodiment includes a voltage detection circuit 33 that serves as a voltage detection unit, a resistor 45, and a resistor 46 in addition to the components of the drive device 9 according to the first embodiment described with reference to FIG. 1.

The drive device 9 according to the present embodiment has the voltage detection circuit 33 with its detection end 76 connected between the other terminal 26b of the resistor 25 and a connection node 77. An overcurrent or the like related to the linear solenoid valve SL is detected by the voltage detection circuit 33 detecting voltages obtained by dividing the output terminal voltage using the resistors 45 and 46. One end side of the resistor 45 is connected to a connection node 28 between the drain D of the high-side MOSFET 17 and the positive electrode (+B) of the battery VB. The other end side of the resistor 45 is connected to the connection node 77. One end side of the resistor 46 is connected to the connection node 77. The other end side of the resistor 46 is connected to the ground gr1.

The voltage detection circuit (voltage detection unit) 33 according to the present embodiment detects a voltage supplied to the coil 5 by way of the third current path 50. The control unit 16 according to the present embodiment stops PWM control in the case where it is determined that a ground short circuit or a battery short circuit has occurred on the basis of an overcurrent detected by the overcurrent detection circuit (overcurrent detection unit) 40.

The voltage detection circuit 33 stores the value of a voltage that flows during normal supply of a drive signal as a predetermined voltage value [mV] for abnormal voltage detection, and always compares the voltage value at the detection end 76 with the predetermined voltage value [mV]. In the case where the voltage detection circuit 33 has detected a voltage value that exceeds the predetermined voltage value [mV], the control unit 16 which has received the voltage value recognizes that the voltage determination is abnormal and that a ground short circuit or a battery short circuit apparently has occurred.

The same effect as that obtained with the first embodiment can be obtained also with the present embodiment described above.

Third Embodiment

Figure 7:
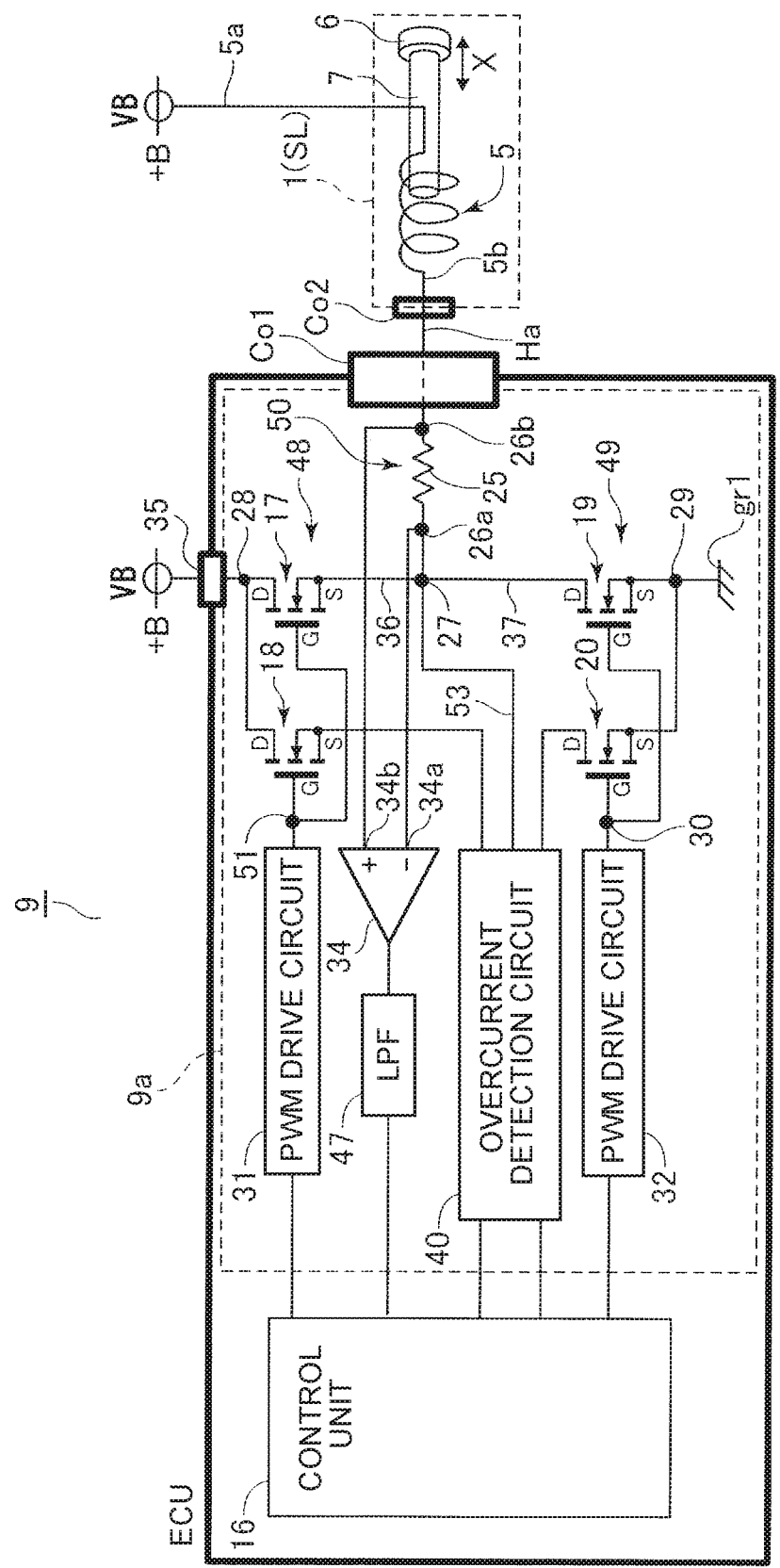
FIG. 7 is a diagram illustrating a drive device according to a third embodiment and a linear solenoid valve to which the drive device is connected.

Next, a drive device according to a third embodiment will be described with reference to FIG. 7. FIG. 7 is a diagram illustrating the drive device according to the present embodiment and the linear solenoid valve to which the drive device is connected. In the present embodiment, members that are the same as those of the first embodiment are denoted by the same reference numerals, and members with the same configuration and function will not be described.

That is, in the drive device 9 according to the present embodiment, in contrast to the configuration of the drive device 9 according to the first embodiment described with reference to FIG. 1, the linear solenoid valve SL is drivably controlled with one end portion 5a of the coil 5 connected to the positive electrode (+B) side of the battery VB and with the drive device 9 connected to the other end portion 5b of the coil 5. In other words, the drive device 9 is connected to the downstream side of the linear solenoid valve SL in the supply direction of the drive signal.

That is, the high-side MOSFET 17 is activated to be turned on when the pulses of a PWM signal are at High (+) and turned off when the pulses are at Low (−), and the low-side MOSFET 19 is activated by a PWM signal that is out of phase with the PWM signal for the high-side MOSFET 17 to be turned on when the pulses of the PWM signal are at High (+) and turned off when the pulses are at Low (−). Consequently, a current applied from the positive electrode (+B) of the battery VB to the one end portion 5a of the coil 5 is applied from the other end portion 5b of the solenoid portion 1 to the third current path 50 via the harness Ha. The current passes through a current path between the drain and the source of the high-side MOSFET 17, or through a current path between the source and the drain of the low-side MOSFET 19, as a drive signal corresponding to the PWM signal, and drives the linear solenoid valve SL.

When a battery short circuit in which the harness Ha is caught in the valve body, for example, to be short-circuited with the positive electrode (+B) of the battery VB is caused, an overcurrent flows through the low-side MOSFET 19 on the lower side. When a ground short circuit with the negative electrode (ground) of the battery VB is caused, an overcurrent flows through the high-side MOSFET 17 on the upper side. The occurrence of a battery short circuit or a ground short circuit can be determined when the overcurrent detection circuit 40 detects such an overcurrent.

Thus, the same effect as that obtained with the first embodiment can be obtained also with the present embodiment described above.

As has been described above, the first to third embodiments provide a drive device (9) connected to a solenoid valve (SL), one end portion (5a) of a coil (5) of which is connected to a ground (gr2) that is continuous with a negative electrode side of a battery (VB) and which is drivably controlled in accordance with a drive signal input to the other end portion (5b) of the coil, the drive device (9) including:

a first current path (48) that has a high-side switching element (17) connected to a positive electrode (+B) side of the battery;

a second current path (49) that has a low-side switching element (19) connected to a ground (gr1) that is continuous with the negative electrode side of the battery;

a third current path (50) connected to the other end portion (5b) of the coil (5) and positioned between the first current path (48) and the second current path (49);

a drive unit (31, 32) that supplies a control signal to each of the high-side switching element (17) and the low-side switching element (19) and that performs control so as to generate the drive signal by alternately switching the first current path (48) and the third current path (50), and the second current path (49) and the third current path (50), between a conductive state and a non-conductive state; and an overcurrent detection unit (40) that detects that an overcurrent that exceeds a value of a current that flows during normal supply of the drive signal has flowed through the first current path (48) and the second current path (49).

Consequently, it is possible for the drive device which drives the solenoid valve to precisely detect the occurrence of a battery short circuit and a ground short circuit by detecting which of the first current path and the second current path an overcurrent has flowed through without separation based on a detected voltage as in the comparative example.

The drive device (9) according to the first to third embodiments further includes a control unit (16) that executes determination processing (S5, S6) in which occurrence of a ground short circuit at a voltage lower than a normal operation range of the solenoid valve (SL) is determined in the case where the overcurrent detection unit (40) detects that the overcurrent has flowed through the first current path (48), and in which occurrence of a battery short circuit at a voltage higher than the normal operation range of the solenoid valve (SL) is determined in the case where the overcurrent detection unit (40) detects that the overcurrent has flowed through the second current path (49).

Consequently, a battery short circuit and a ground short circuit can be detected precisely by the overcurrent detection circuit 40 monitoring currents through the first current path and the second current path.

The drive device (9) according to the first to third embodiments further includes a current detection unit (34) that detects a current that flows through the coil (5) by way of the third current path (50), and the control unit (16) executes wire breakage determination processing (S7) for determining a wire breakage state, in which the solenoid valve (SL) is electrically disconnected, in the case where the current which flows through the third current path (50) is no longer detected by the current detection unit (34).

Consequently, in the case where the current which flows through the third current path 50 is no longer detected by the current detection circuit 34, the control unit 16 can execute wire breakage determination processing in which a wire breakage state related to the linear solenoid valve SL is determined to turn on a wire breakage flag.

In the drive device (9) according to the first to third embodiments, further, the high-side switching element and the low-side switching element are constituted from a high-side transistor (17) and a low-side transistor (19) of the same conductivity type;

the drive device (9) further includes a first determination transistor (18) and a second determination transistor (20) of the same conductivity type as the high-side transistor (17) and the low-side transistor (19);

a signal input electrode (G) of the high-side transistor (17) is connected to the drive unit (31, 32), and one end (D) of a current path of the high-side transistor (17) is connected to the positive electrode side of the battery;

a signal input electrode (G) of the low-side transistor (19) is connected to the drive unit (31, 32), and one end (S) of a current path of the low-side transistor (19) is connected to the ground (gr1);

a signal input electrode (G) of the first determination transistor (18) is connected to the drive unit (31, 32), and one end (D) of a current path of the first determination transistor (18) is connected to a point in the first current path (48) between the high-side transistor (17) and a positive electrode (+B) of the battery (VB);

a signal input electrode (G) of the second determination transistor (20) is connected to the drive unit (31, 32), and one end (S) of a current path of the second determination transistor (20) is connected to a point in the second current path (49) between the one end (S) of the current path of the low-side transistor (19) and the ground (gr1); and the other end (S, D) of each of the current paths of the first determination transistor (18) and the second determination transistor (20) is connected to the overcurrent detection unit (40).

Consequently, the solenoid valve can be drivably controlled adequately via the high-side MOSFET in the first current path and the low-side MOSFET in the second current path, and the overcurrent which flows during a ground short circuit and a battery short circuit can be precisely detected by the overcurrent detection circuit to which the first determination MOSFET and the second determination MOSFET are connected.

In the drive device (9) according to the first to third embodiments, the high-side transistor, the low-side transistor, the first determination transistor, and the second determination transistor are constituted from an N-channel or P-channel MOSFET of an enhancement type, or an N-channel or P-channel MISFET of an enhancement type.

Consequently, it is possible to simplify PWM control performed by PWM drive circuits and overcurrent detection performed by an overcurrent detection circuit by using MOSFETs or MISFETs of an enhancement type through which a current does not flow when the gate voltage is 0 [V].

Possibility of Other Embodiments

In the embodiments described above, the drive device 9 uses N-channel MOSFETs as the switching elements. However, the present embodiment is not limited thereto. For example, the drive device 9 may use P-channel MOSFETs, or N-channel or P-channel MISFETs. Alternatively, bipolar transistors can also be used as the switching elements in place of such MOSFETs and MISFETs. Furthermore, other switching elements that mechanically perform switching operation can also be used.

In the embodiments described above, in addition, the drive device 9 is used as a transmission device for vehicles in which a linear solenoid valve is used. However, the drive device may be used as a transmission device for hybrid vehicles on which a motor generator is mounted in place of a torque converter, for example, and in which a linear solenoid valve is used. Furthermore, the drive device may be used as a transmission device for electric vehicles driven by an electric motor.

INDUSTRIAL APPLICABILITY

The present drive device can be used to drive a solenoid valve provided in a transmission device for vehicles or the like, and is particularly suitably used when a high precision in detecting the occurrence of a battery short circuit and a ground short circuit is required.

The invention claimed is:

1. A drive device connected to a solenoid valve, one end portion of a coil of which is connected to a ground that is continuous with a negative electrode side of a battery and which is drivably controlled in accordance with a drive signal input to the other end portion of the coil, the drive device comprising:
a first current path that has a high-side switching element connected to a positive electrode side of the battery;
a second current path that has a low-side switching element connected to a ground that is continuous with the negative electrode side of the battery;
a third current path connected to the other end portion of the coil and positioned between the first current path and the second current path;
a drive unit that supplies a control signal to each of the high-side switching element and the low-side switching element and that performs control so as to generate the drive signal by alternately switching the first current path and the third current path, and the second current path and the third current path, between a conductive state and a non-conductive state;
an overcurrent detection unit that detects that an overcurrent that exceeds a value of a current that flows during normal supply of the drive signal has flowed through the first current path and the second current path; and
a control unit that executes determination processing in which occurrence of a ground short circuit at a voltage lower than a normal operation range of the solenoid valve is determined in the case where the overcurrent detection unit detects that the overcurrent has flowed through the first current path, and in which occurrence of a battery short circuit at a voltage higher than the normal operation range of the solenoid valve is determined in the case where the overcurrent detection unit detects that the overcurrent has flowed through the second current path.

2. The drive device according to claim 1, wherein:
the high-side switching element and the low-side switching element are constituted from a high-side transistor and a low-side transistor of the same conductivity type;
the drive device further comprises a first determination transistor and a second determination transistor of the same conductivity type as the high-side transistor and the low-side transistor;
a signal input electrode of the high-side transistor is connected to the drive unit, and one end of a current path of the high-side transistor is connected to the positive electrode side of the battery;
a signal input electrode of the low-side transistor is connected to the drive unit, and one end of a current path of the low-side transistor is connected to the ground;
a signal input electrode of the first determination transistor is connected to the drive unit, and one end of a current path of the first determination transistor is connected to a point in the first current path between the high-side transistor and a positive electrode of the battery;
a signal input electrode of the second determination transistor is connected to the drive unit, and one end of a current path of the second determination transistor is connected to a point in the second current path between the one end of the current path of the low-side transistor and the ground; and
the other end of each of the current paths of the first determination transistor and the second determination transistor is connected to the overcurrent detection unit.

3. The drive device according to claim 2, wherein the high-side transistor, the low-side transistor, the first determination transistor, and the second determination transistor are constituted from an N-channel or P-channel MOSFET of an enhancement type, or an N-channel or P-channel MISFET of an enhancement type.

4. The drive device according to claim 1, further comprising:
a current detection unit that detects a current that flows through the coil by way of the third current path, wherein
the control unit executes wire breakage determination processing for determining a wire breakage state, in which the solenoid valve is electrically disconnected, in the case where the current which flows through the third current path is no longer detected by the current detection unit.

5. The drive device according to claim 4, wherein:
the high-side switching element and the low-side switching element are constituted from a high-side transistor and a low-side transistor of the same conductivity type;
the drive device further comprises a first determination transistor and a second determination transistor of the same conductivity type as the high-side transistor and the low-side transistor;
a signal input electrode of the high-side transistor is connected to the drive unit, and one end of a current path of the high-side transistor is connected to the positive electrode side of the battery;

a signal input electrode of the low-side transistor is connected to the drive unit, and one end of a current path of the low-side transistor is connected to the ground;

a signal input electrode of the first determination transistor is connected to the drive unit, and one end of a current path of the first determination transistor is connected to a point in the first current path between the high-side transistor and a positive electrode of the battery;

a signal input electrode of the second determination transistor is connected to the drive unit, and one end of a current path of the second determination transistor is connected to a point in the second current path between the one end of the current path of the low-side transistor and the ground; and the other end of each of the current paths of the first determination transistor and the second determination transistor is connected to the overcurrent detection unit.

6. The drive device according to claim 5, wherein the high-side transistor, the low-side transistor, the first determination transistor, and the second determination transistor are constituted from an N-channel or P-channel MOSFET of an enhancement type, or an N-channel or P-channel MISFET of an enhancement type.

7. The drive device according to claim 1, wherein:

the high-side switching element and the low-side switching element are constituted from a high-side transistor and a low-side transistor of the same conductivity type;

the drive device further comprises a first determination transistor and a second determination transistor of the same conductivity type as the high-side transistor and the low-side transistor;

a signal input electrode of the high-side transistor is connected to the drive unit, and one end of a current path of the high-side transistor is connected to the positive electrode side of the battery;

a signal input electrode of the low-side transistor is connected to the drive unit, and one end of a current path of the low-side transistor is connected to the ground;

a signal input electrode of the first determination transistor is connected to the drive unit, and one end of a current path of the first determination transistor is connected to a point in the first current path between the high-side transistor and a positive electrode of the battery;

a signal input electrode of the second determination transistor is connected to the drive unit, and one end of a current path of the second determination transistor is connected to a point in the second current path between the one end of the current path of the low-side transistor and the ground; and the other end of each of the current paths of the first determination transistor and the second determination transistor is connected to the overcurrent detection unit.

8. The drive device according to claim 7, wherein the high-side transistor, the low-side transistor, the first determination transistor, and the second determination transistor are constituted from an N-channel or P-channel MOSFET of an enhancement type, or an N-channel or P-channel MISFET of an enhancement type.

* * * * *